March 29, 1960 C. HUETTEN ET AL 2,931,003

SPRING PIN CASCADED CIRCUIT CARDS

Filed Sept. 27, 1955

INVENTORS
Clarence Huetten
Myron E. Hinebaugh
BY [signature]
ATTORNEY 2,931,003

SPRING PIN CASCADED CIRCUIT CARDS

Clarence Huetten, Indianapolis, Ind., and Myron E. Hinebaugh, Oak Park, Ill., assignors to P. R. Mallory & Co., Inc., Indianapolis, Ind., a corporation of Delaware Application September 27, 1955, Serial No. 536,966

9 Claims. (Cl. 339—17)

This invention relates generally to electric circuit assemblies and has particular reference to devices therein including means and method for cascading and integrating printed circuit component stages.

It has been found from an analysis of existing printed circuit packages and their integration that a major problem in packaging design is that of attaining three-dimensional flexibility. While multiplanar stacking of chassis will achieve an end of rectangular parallelepiped equipment configurations, this usually requires several chassis, separate means for supporting these chassis, and wires soldered between decks of the chassis to effect electrical connections. This is generally unsuitable for automatic assembly and ready maintenance.

The present invention of spring cascading construction substantially overcomes these objections, supra, and allows for three-dimensional flexibility, since it is adaptable to a multiplicity of conformations. Further, it provides a means of electronic package design that allows a single electronic section or component card to be replaced as required. In addition, the spring hollow pins acting as single connective members between decks, serve the triple function of between deck electrical connections, component card support and shielding for insulated wire so that coaxial electrical connections may be made between without employing coaxial cable and without utilizing additional card area in addition to that used by the connective and support means. The hollow spring pins or connective members will thus serve the purposes of tandem electrical connections and card supports. As a great advantage, it is apparent that soldering is not necessary to accomplish any of these connections. Therefore, the present system of circuit assembly packaging and integration is suitable for the automatic assembly of printed circuit cards without the need for expensive and complicated equipment. The term pin, as hereinafter described, is hollow.

It is therefore an object of the present invention to provide means for multiplanar stacking of chassis in any desired tri-dimensional manner by means of spring pin cascading of the units therein, said cascading allowing for substantially automatic assembly and ready maintenance.

Another object of the present invention is to provide stacking means for multiple chassis holding electrical components thereon by means of readily adaptable spring connectors which allow for concurrent electrical connections thereby in a positive yet flexible manner and whereby connections between stages may be effectuated with little trouble.

Still another object of the present invention is to provide a new and novel means for effectuating circuit assembly between components situated on separate printed circuit cards or chassis in a manner such as to obviate costly assembly techniques and constructions.

Yet another object of the present invention is to provide connector pins traversing circular hollow terminals staked in printed circuit chassis or cards, said pins having a resilience such as to tightly engage the sides of said terminals to make complete circumferential electrical contact therewith in a positive and adjustable manner in accordance with circuit design considerations and needs.

Therefore, another object of the present invention is to provide an automation construction for assembling and integrating sub-chassis and chassis assemblies of stacked prefabricated electronic forms or stages in a manner such as to eliminate separate electrical welding or soldering needs and whereby the simplified techniques employed hereby may make for tri-dimensional planar flexibility adapted for use in environments of close tolerance and restricted volume.

Still another object of the present invention is to provide means and methods for integrating printed circuit panels in a tri-dimensional configuration, said configuration being adaptable to the design needs of automation requirements of sub-chassis and chassis electrical connections without soldering or weld joining.

Yet another object of the present invention is to provide means and methods for constructing and interconnecting an integrated plurality of preforms of printed circuitry.

Another object of the present invention is to provide novel means and methods for integrating a multiplicity of preprinted circuits in desired combinations without the necessity of making special electrical connections therebetween.

With the above and other objects in view that will become apparent as the nature of the invention is better understood, the panel consists of the novel form, combination and arrangement of parts hereinafter more fully described and shown in the accompanying drawings and claims.

Figures 1, 2, 3, 4, 5, 6, 7, 8, 9, 10:
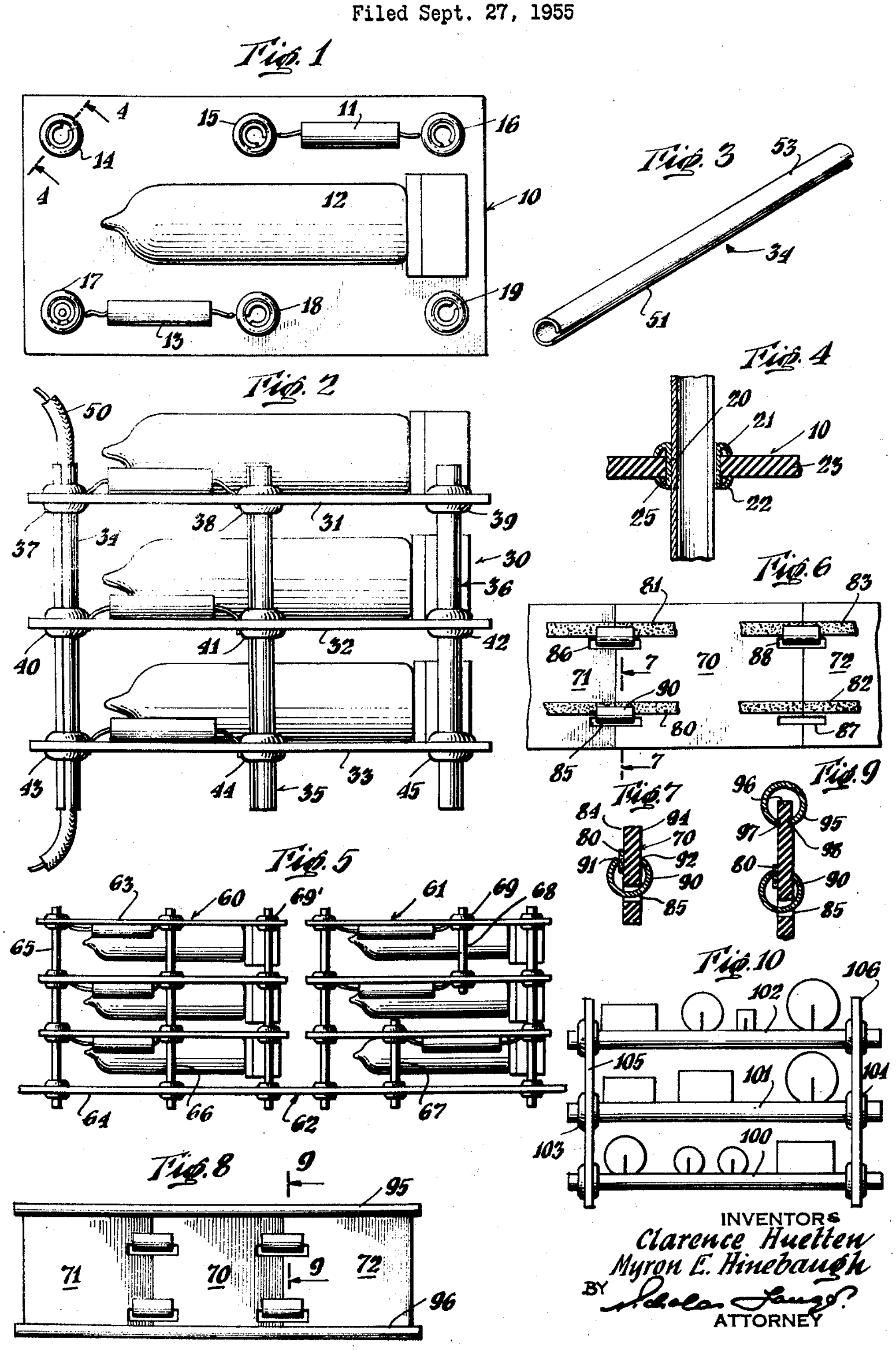
Fig. 1 is a plan view of a component card incorporating aspects of the present invention as adapted to illustrate the method of assembly of individual cards in accordance with the spring pin construction and mounting thereof.
Fig. 2 is a cross-sectional view of a packaged electronic unit of printed circuit cards including electronic components integrated and interconnected by the spring pin connections and spacers of the present invention and wherein the cards are adapted to be predeterminedly spaced from one another and supported thereby without any intervening mounts or joining devices.
Fig. 3 is a pictorial illustration of a spring pin connector of the present invention as adapted to illustrate the mode of construction thereof and as depicting how individual lengths thereof may be fabricated in accordance with desired electrical and spatial requirements.
Fig. 4 is a cross-sectional view, with portions in elevation, of a spring connector of the present invention as cooperatively arranged with respect to its associated circular ring and eyelet terminal of a printed circuit card, as further shown as being taken along line 4—4 of Fig. 1.

Fig. 5 is a side elevational view of an embodiment of the invention wherein the spring pin assemblies, such as shown in Fig. 2, may be integrated to become individual subassemblies of a combined larger assembly through the utilization of the spring pin connectors of the present invention, the compiled assembly thus being shown to be readily adaptable to form any pattern of suitable and desired tri-dimensional configuration;

Fig. 6 is a plan view of a linear type of cascaded assembly adapted to be constructed through utilization of sections of spring pin connections;

Fig. 7 is a cross-sectional view of a linear cascade type of connection as shown in Fig. 6 and taken along line 7—7 thereof;

Fig. 8 is a plan view of the construction of a linear type of cascaded structure in which each of the card units of the assembly is maintained and supported on each side of the card by means of the spring connectors of the present invention, in addition to the mode of connection shown in Fig. 6;

Fig. 9 is a cross-sectional view of the embodiment of the connection shown in Fig. 8 and as taken along line 9—9 thereof; and Fig. 10 is a side view of another embodiment of the invention wherein components on each of the card units of the integrated assembly may may be directly connected to the spring pin connectors which are adapted to be contained in a longitudinal fashion within eyelet sockets cooperating therewith to interjoin the individual card units.

Generally speaking, the present invention provides means for integrating and assembling individual cards or preforms having electrical components situated thereon. The configuration of the assemblies may be varied in accordance with the exigencies of space and dimension. Thus, if it is desired, each card may be superimposed, one above the other, so as to lie in parallel, vertical planes at predetermined distances along said vertical axis. Moreover, should side by side, or longitudinal, assembly be required, the assembly may be accomplished through the use of the spring pin connections of the present invention. The spring pins, as they cooperate with the annular rings, or as they interconnect conductive strips, afford positive electrical connections between units, cards or preforms. In addition, the pins are so constructed to afford the necessary support for the integrated individual units of the assembly. Thus, there is provided means for constructing three-dimensional conformations of interconnected electrical stages with a flexibility and adaptability that has greatly advanced the techniques and methods for automatically assembling electrical units without the necessity of utilizing soldering or other electrical joining methods.

Referring now to Fig. 1, there is illustrated a chassis or card 10 fabricated of an insulating material of predetermined cross-sectional thickness which is adapted to be utilized in printed circuit techniques by which electrical components 11, 12 and 13 are interconnected via conductors which are joined to ring terminals 14, 15, 16, 17, 18 and 19. Each of these terminals, as shown in Fig. 4, comprises a circular main section 20 having an inner wall 25 to which are joined laterally extending upper and lower flanges 21 and 22 which are adapted to hold the thickness 23 of the component card 10 between their flanges to be tightly gripped by the bowed contour thereof.

As shown in Fig. 2, the component cards may be assembled to form a packaged electronic unit or integration 30 by decking individual cards 31, 32 and 33 in parallel, horizontal planes by means of passing the single connective members 34, 35 and 36 through ring terminals 37–45 inserted in each of the cards in accordance with a desired configuration and connective arrangement. The connecting members, such as spring connector 34, are shown in Fig. 3. Each pin comprises a tubular length of metal closed except for a slot 51 which runs the entire length thereof. The tube thus formed is constructed from spring stock material which may be suitably coated, with the material choice determined by the electrical and mechanical properties desired. As shown in the figures, more particularly in Fig. 3, the outside wall 53 of the pin is adapted to tightly abut inner wall 25 (Fig. 4) of the terminals to make good electrical contact therebetween. This is so because the spring pins are designed to provide high normal contact forces, thereby resulting in extremely low contact resistance. Moreover, the pins provide individual compliance at each circular terminal, thus assuring a separate support function thereat. The assembly shown in Fig. 2 could also allow for an additional conductor 50 to pass through the connectors to form a coaxial line connective assembly. Connection can be made to the insulated cable in the coaxial construction by scraping the insulation therefrom so as to expose the wire to be connected.

Thus, in such an assembly the connective spring pins between decks of chassis may serve the triple functions of between-deck electrical connections, component card support and shielding for insulated wire, so that coaxial electrical connections may be made therebetween without employing coaxial cable and without utilizing additional card area in addition to that used by the connective and support means. These connecting springs will thus serve the purposes of tandem electrical connections and card support. Soldering is not necessary to make any of these connections.

In such an assembly, further, the entire unit may be disassembled by slipping the spring connecting pin links out of the cooperating ring terminals of the component cards. Then a given electronic card may be replaced, repaired or individually tested as required.

In Fig. 5 there is illustrated an embodiment of the invention where individual spring pin assemblies, such as shown in Fig. 2, may be incorporated as sub-assemblies or plug-on units 60 and 61 in a larger assembly or chassis 62. Here, too, the component cards, such as 63 and 64, are interconnected in discretely spaced levels by means of spring pin connectors, such as 65, 66, 67 and 68, which are adapted to pass through annular terminals, such as 69 and 69'. In the integrated and completed unit 62, the pin connectors, it is seen, need not penetrate all the cards but may simply integrate individual component cards. It is to be further observed that in the integration shown in Fig. 5 both lateral and vertical extensions of the individual component cards may be afforded, as designed to be mounted on a larger chassis 62.

In Fig. 6 the principles of the invention have been modified to allow for the interconnection of panels 70, 71 and 72, having conductors or pads 80, 81, 82 and 83 etched or printed thereon. As illustrated in Fig. 7, conductor 80 lies on a surface 84 of panel 70. Interconnecting these panels are slots 85, 86, 87 and 88. Spring connectors, such as 90, are adapted to pass through their individual slots, such as 85, so that edges 91 and 92 of pin 90 make contact with printed conductor 80 on the underside 94 of panel 70. There is thus provided means for connecting printed circuit cards in a linear fashion.

If additional support is necessary for linear integration of separate multiple cards, then the construction shown in Figs. 8 and 9 may be provided. Besides the means shown in Fig. 7, then the construction may be extended to utilize longitudinal strips of spring connectors 95 and 96. The connectors, for example 95, as shown in Fig. 9, are slipped over each individual edge, such as 96, along the entire length thereof. Narrow printed or grooved lines, such as 97 and 98, located near the edges of each card, will serve to assure the retention of the spring pins.

In Fig. 10 there is shown the means whereby the linear, electrically connected component cards supported by the longitudinally extending spring pin connectors may be cascaded. Spring pin connectors 100, 101 and 102 of the linear assemblies fit into the circular terminals, such as 103 and 104, mounted in printed circuit side panels 105 and 106. It is apparent, moreover, that these construcitons provide means because of the adaptability and flexibility of the features of the invention, to effect an enclosed integration of printed circuit preforms or cards without the necessity of soldered or welded connections.

While the present invention as to its objects and advantages has been described herein as carried out in specific embodiments thereof, it is not desired to be limited thereby, but it is intended to cover the invention within the spirit and scope of the appended claims.

We claim:

1. Assembly means comprising individual cards capable of carrying components thereon, said cards having determined dimensions and thickness, individual apertures cut in said thickness of said cards, said apertures having a metal lining thereabout and abutting the wall thereof in a substantially tight manner to afford good contact therebetween, a slotted pin adapted to entirely penetrate said apertures, said pin being hollow with the same diameter throughout and having a sufficient strength with the contact made between said lining of said aperture and said pin as it penetrates said aperture of sufficient tightness and grip to allow said pin to connectively support said card so that each card may be used in a desired assembly of determined configuration.

2. Assembly means comprising individual cards made of electrical insulating material capable of carrying components thereon, said cards having determined dimensions and thickness, apertures cut in said thickness of said cards, said apertures having a metal lining thereabout and abutting the wall thereof in a substantially tight manner to afford good contact therebetween, a hollow slotted pin adapted to entirely penetrate said apertures, said pin having the same diameter throughout and being of a determined strength, with the contact made between said lining of said aperture and said pin as it penetrates said aperture of sufficient tightness and grip to allow said pin to connectively support said card so that each card may be used in a desired assembly of determined configuration.

3. Assembly means comprising individual insulating cards capable of carrying electrical components thereon, said cards having determined dimensions and thickness, apertures cut through said thickness of said cards, said apertures having a metal sleeve contained thereabout and abutting the wall thereof in a substantially tight manner to afford good contact therebetween, a resilient pin having a slot therealong adapted to pass through each of said apertures, said pin being hollow and of the same diameter throughout and having a dimension and strength such that a good electrical connection is made between it and said sleeve of said aperture so as to allow said pin to support said card and to conduct electric current therethrough so that each card may be used in a desired electrical wiring assembly of determined configuration.

4. Assembly means comprising individual insulating cards capable of carrying electrical components thereon, said cards having determined dimensions and thickness, apertures cut through said thickness of said cards, said apertures having a metal ring lining thereabout, a strong, resilient length of metal passing entirely through said metal ring to afford good electrical contact therebetween, said length of metal being slotted and hollow with the same diameter throughout and having a resilience such that the connection made between it and said ring of said aperture is of good tightness so as to allow said length of metal to conduct electric current between each card connected thereto built on several levels in determined planar configuration.

5. Assembly means comprising individual cards fabricated of insulating material capable of carrying electrical components thereon, said cards having determined dimensions and thickness, individual circular apertures cut through said thickness of said cards, said apertures each having a metal ring around the circumference thereof gripping the aperture in a substantially tight manner, a metal tube having a slot thereon, said tube adapted to entirely penetrate said apertures, said tube being of the same diameter throughout and having a resilience and strength such that good electrical contact is made between it and said ring of said aperture as the tube penetrates the same, whereby said tube is adapted to electrically connect and space said cards so that each card may be used in a desired assembly of determined electrical design.

6. Printed circuit assembly means comprising a plurality of individual cards having printed circuits and electrical components thereon, said cards having determined dimensions and thickness, individual apertures cut at discrete intervals through said thickness of said cards, said apertures each having a metal lining thereabout and abutting the wall thereof in a substantially tight manner, a metal hollow tube being of the same diameter throughout adapted to penetrate said lined apertures, said tube being slotted and having a resilience adapting the same to make contact between it and said lining of said aperture as it penetrates said aperture whereby said tube makes electrical connection between said cards and supports the same at discrete planes in accordance with desired electrical and physical layouts.

7. An assembly comprising a plurality of individual mounting means, each of said means bearing strips of conductors and adapted to support components thereon connected to said strips, said individual means having determined thickness and dimensions, apertures formed in each of said means and tubular, slotted connectors being of the same diameter throughout and passing therethrough, some of said connectors making contact with said conductors whereby said individual mounting means are interjoined and supported in any desired planar configuration while interconnecting said strips of conductors.

8. An assembly comprising a plurality of individual mounting means, each of said means bearing strips of conductors and adapted to support components thereon connected to said strips, said individual means having determined thickness and dimensions, some of said means adapted to be adjacent each other in a horizontal plane and others of said means placed above each other in parallel planes, apertures formed in each of said means and hollow, slotted, tubular connectors being of the same diameter throughout passing therethrough, some of said connectors making contact with said conductors whereby said individual mounting means are interjoined and supported in any desired vertical and horizontal planar configuration while interconnecting said strips of conductors.

9. An assembly comprising a plurality of individual mounting means, each bearing strips of conductors and adapted to support components thereon connected to said strips, said individual means having determined thickness and dimensions, apertures formed in each of said means and hollow, slotted, tubular connectors being of the same diameter throughout passing therethrough, some of said connectors making contact with said conductors, an electrical insulated conductor adapted to centrally pass through some of said hollow connectors to form coaxial cables thereby and whereby said individual mounting means are interjoined and supported in any desired planar configuration while interconnecting said strips of conductors.

References Cited in the file of this patent

UNITED STATES PATENTS

| | | |
|---|---|---|
| 2,066,876 | Carpenter et al. | Jan. 5, 1937 |
| 2,515,638 | Doucette | July 18, 1950 |
| 2,593,479 | Nieter | Apr. 22, 1952 |
| 2,616,994 | Luhn | Nov. 4, 1952 |
| 2,647,990 | Peterson | Aug. 4, 1953 |
| 2,650,267 | Walters | Aug. 25, 1953 |
| 2,740,097 | Edelman et al. | Mar. 27, 1956 |
| 2,752,580 | Shewmaker | June 26, 1956 |
| 2,796,559 | Feucht | June 18, 1957 |

FOREIGN PATENTS

| | | |
|---|---|---|
| 19,919 | Great Britain | of 1892 |
| 978,844 | France | Nov. 29, 1950 |

OTHER REFERENCES

Aerovox: Electronic design, November 1955, page 25.

Lawson, A. A.: Electrical Mfg., October 1954, page 135. (Copy in Scientific Library.)